United States Patent
Lai et al.

(10) Patent No.: US 10,777,461 B2
(45) Date of Patent: Sep. 15, 2020

(54) METHOD FOR MANUFACTURING A CHIP PACKAGE

(71) Applicant: Comchip Technology Co., Ltd., New Taipei (TW)

(72) Inventors: Chien-Chih Lai, New Taipei (TW); Hung-Wen Lin, New Taipei (TW)

(73) Assignee: COMCHIP TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/403,625

(22) Filed: May 6, 2019

(65) Prior Publication Data
US 2020/0235009 A1 Jul. 23, 2020

(30) Foreign Application Priority Data
Jan. 18, 2019 (TW) .............................. 108102068 A

(51) Int. Cl.
*H01L 21/78* (2006.01)
*H01L 21/56* (2006.01)
*H01L 23/00* (2006.01)

(52) U.S. Cl.
CPC ............ *H01L 21/78* (2013.01); *H01L 21/561* (2013.01); *H01L 24/94* (2013.01)

(58) Field of Classification Search
CPC ................................ H01L 21/78; H01L 24/95
See application file for complete search history.

(56) References Cited

U.S. PATENT DOCUMENTS

| | | | |
|---|---|---|---|
| 9,682,854 B2 | 6/2017 | Man et al. | |
| 2011/0175209 A1* | 7/2011 | Seddon | H01L 21/76898 257/659 |
| 2013/0267076 A1* | 10/2013 | Lei | B23K 26/364 438/460 |

* cited by examiner

Primary Examiner — Jay C Chang
Assistant Examiner — Mikka Liu
(74) Attorney, Agent, or Firm — CKC & Partners Co., LLC

(57) ABSTRACT

A method of manufacturing chip package is disclosed. The method includes steps of providing a wafer with an upper surface and a lower surface opposite thereto, in which a plurality of conductive pads are disposed on the upper surface; forming a plurality of conductive bumps on the corresponding conductive pads; thinning the wafer from the lower surface towards the upper surface; forming an insulating layer under the lower surface; etching the upper surface of the wafer to form a plurality of trenches exposing the insulating layer; forming a passivation layer covering an inner wall of each of the trenches; and dicing the passivation layer and the insulating layer along each of the trenches to form a plurality of chip packages.

4 Claims, 8 Drawing Sheets

METHOD FOR MANUFACTURING A CHIP PACKAGE

CROSS-REFERENCE TO RELATED APPLICATION

This application claims priority to Taiwan Application Serial Number 108102068, filed Jan. 18, 2019, which is herein incorporated by reference.

BACKGROUND

Field of Invention

The present disclosure relates to a method of manufacturing a chip package.

Description of Related Art

In one conventional chip packaging process, semiconductor dies are formed by dicing a wafer and are packaged one by one, which is quite time-consuming and complicated. In an alternative process, each of the semiconductor dies is arranged on a carrier board, followed by performing a packaging process and a dicing process to form a plurality of chip packages. This method of manufacturing chip packages is time-consuming and complicated as well, and an alignment offset issue is likely to occur.

SUMMARY

In view of this, one purpose of the present disclosure is to provide a method of manufacturing a chip package to address the abovementioned issues.

One aspect of the present disclosure is to provide a method of manufacturing a chip package. The method includes steps of providing a wafer with an upper surface and a lower surface opposite thereto, in which the wafer comprises a plurality of conductive pads disposed on the upper surface; forming a plurality of conductive bumps on the corresponding conductive pads; thinning the wafer from the lower surface towards the upper surface; forming an insulating layer under the lower surface; etching the upper surface of the wafer to form a plurality of trenches exposing the insulating layer; forming a passivation layer covering an inner wall of each of the trenches; and dicing the passivation layer and the insulating layer along each of the trenches to form a plurality of chip packages.

According to one embodiment of the present disclosure, the passivation layer further covers the upper surface and exposes the conductive bumps.

According to one embodiment of the present disclosure, after the step of providing the wafer, a first thickness of the wafer ranges from 525 μm to 725 μm.

According to one embodiment of the present disclosure, a width of each trench ranges from 50 μm to 60 μm, and a depth of each trench ranges from 55 μm to 105 μm.

According to one embodiment of the present disclosure, after the step of thinning the wafer, a second total thickness of the wafer and the conductive bumps ranges from 100 μm to 150 μm.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
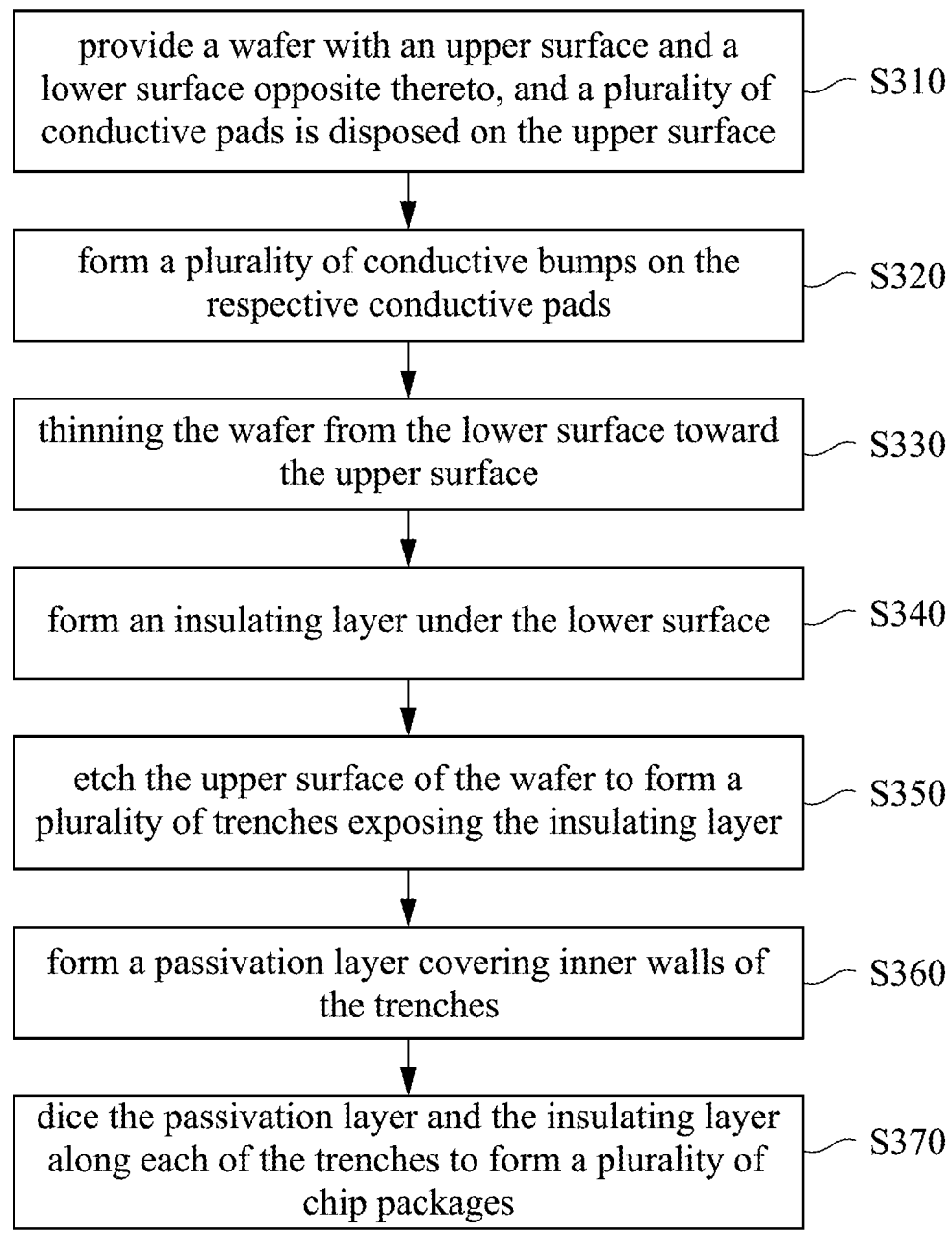
FIG. 1 is a flowchart of a method of manufacturing chip packages according to one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. Other embodiments may be added to an embodiment without further description.

In the following description, certain specific details are set forth in order to provide a thorough understanding of various embodiments of the invention. However, one skilled in the art will understand that the invention may be practiced without these specific details. In other instances, well-known structures and devices are only schematically illustrated in the drawings in order to simplify the drawings.

One aspect of the present disclosure is to provide a method of manufacturing a chip package. The method may reduce the process duration and costs, and the alignment offset issue can be eliminated. FIG. 1 is a flowchart of a method 300 of manufacturing chip packages according to one embodiment of the present disclosure. FIG. 2A to FIG. 2G are schematic sectional views of intermediate stages in the manufacturing of chip packages according to one embodiment of the present disclosure. As shown in FIG. 1, the method 300 includes steps S310 to S370.

Figure 2A:
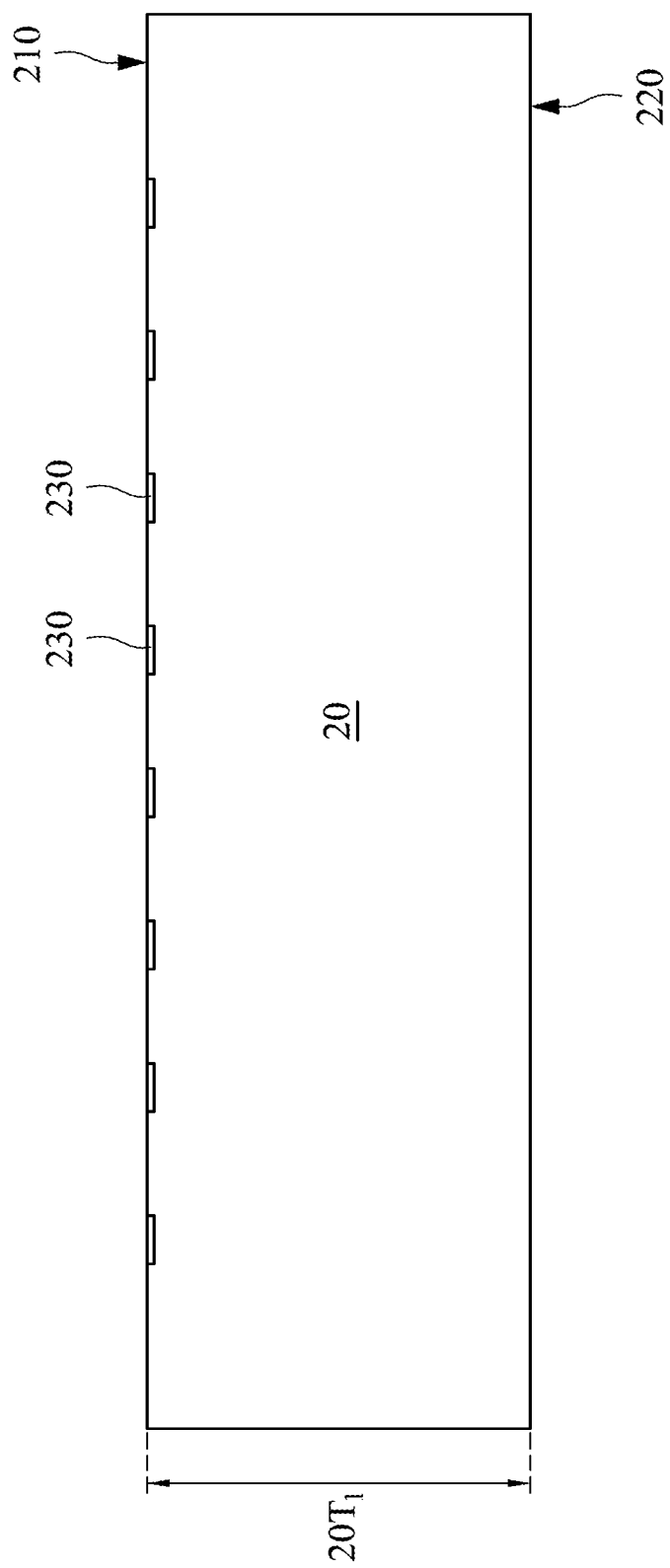
FIG. 2A to FIG. 2G are schematic sectional views of intermediate stages in the manufacturing of chip packages according to one embodiment of the present disclosure.

At step S310, a wafer 20 is provided, as shown in FIG. 2A. Specifically, the wafer 20 has an upper surface 210 and a lower surface 220 opposite thereto. In addition, the wafer 20 includes a plurality of the conductive pads 230 disposed on the upper surface 210. In one example, the wafer 20 may include silicon, germanium, or a Group III to Group V element, but is not limited thereto. In some examples, the conductive pads 230 include copper, nickel, tin, or other suitable conductive material. In some examples, a first thickness 20 $T_1$ of the wafer 20 may range from 525 μm to 725 μm, such as 550 μm, 575 μm, 600 μm, 625 μm, 650 μm, 675 μm, or 700 μm.

Figure 2B:
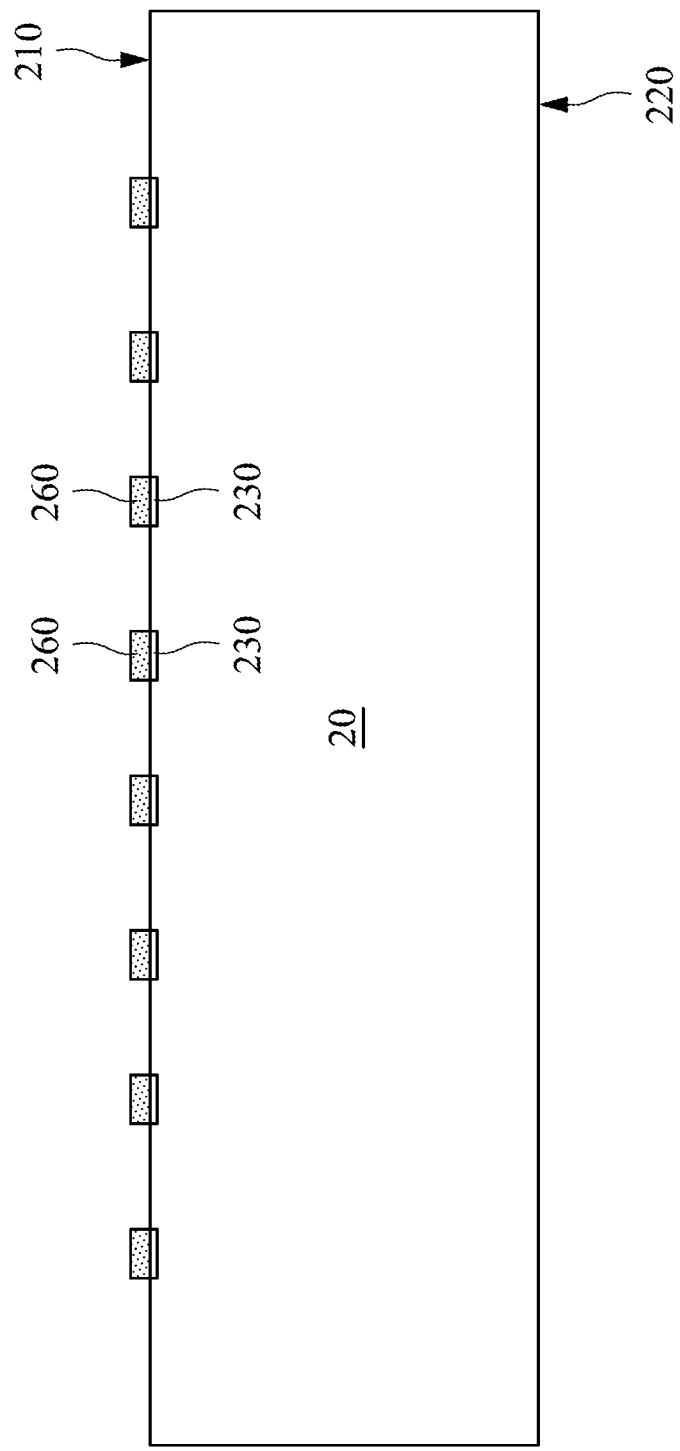

At step S320, a plurality of the conductive bumps 260 are formed on the corresponding conductive pads 230, as shown in FIG. 2B. In one example, a height of the conductive bumps 260 ranges from 20 μm to 45 μm, such as 22 μm, 24 μm, 26 μm, 28 μm, 30 μm, 32 μm, 34 μm, 36 μm, 38 μm, 40 μm, 42 μm, or 44 μm.

In some embodiments, after performing step S320 by forming the conductive bumps 260, a surface treatment layer (not shown) may be formed on the conductive bumps 260. In some embodiments, the surface treatment layer may be a single-layered structure or a multilayered structure composed of sublayers with different materials. The single-layered structure may be a nickel layer or a tin layer, and the multilayered structure may be a stacked layer of nickel layer and tin layer, but is not limited thereto. The surface treatment layer may be formed by a physical process or a chemical process. The physical process may include but not limited to an electrolytic gold/nickel process and a hot air solder leveling process. The chemical process may include but not limited to an electroless nickel immersion gold (ENIG)

process. The surface treatment layer may prevent the conductive bumps 260 from being oxidized by the air.

Figure 2C:
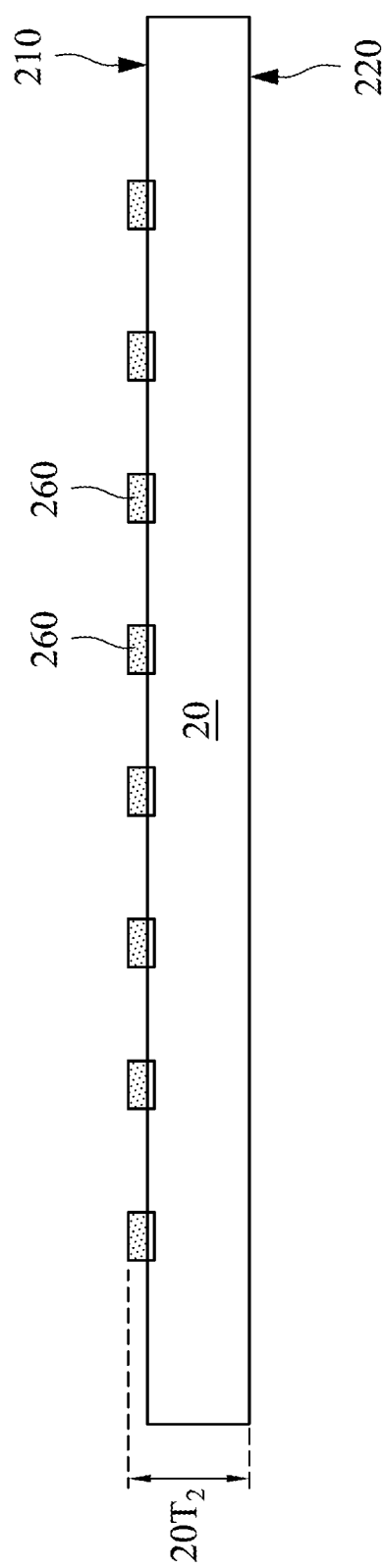

At step S330, the wafer 20 is thinned from the lower surface 220 towards the upper surface 210, as shown in FIG. 2C. The wafer 20 may be thinned by a chemical-mechanical polishing process, a dry-etching process or other suitable processes, such that the subsequently formed chip package may have a smaller size. In some embodiments, after performing the step S330 by thinning the wafer 20, a second total thickness 20 $T_2$ (a total thickness) of the wafer 20 and the conductive bumps 260 may range from 100 µm to 150 µm, such as 110 µm, 115 µm, 120 µm, 125 µm, 130 µm, 135 µm, 140 µm, or 145 µm.

Figure 2D:
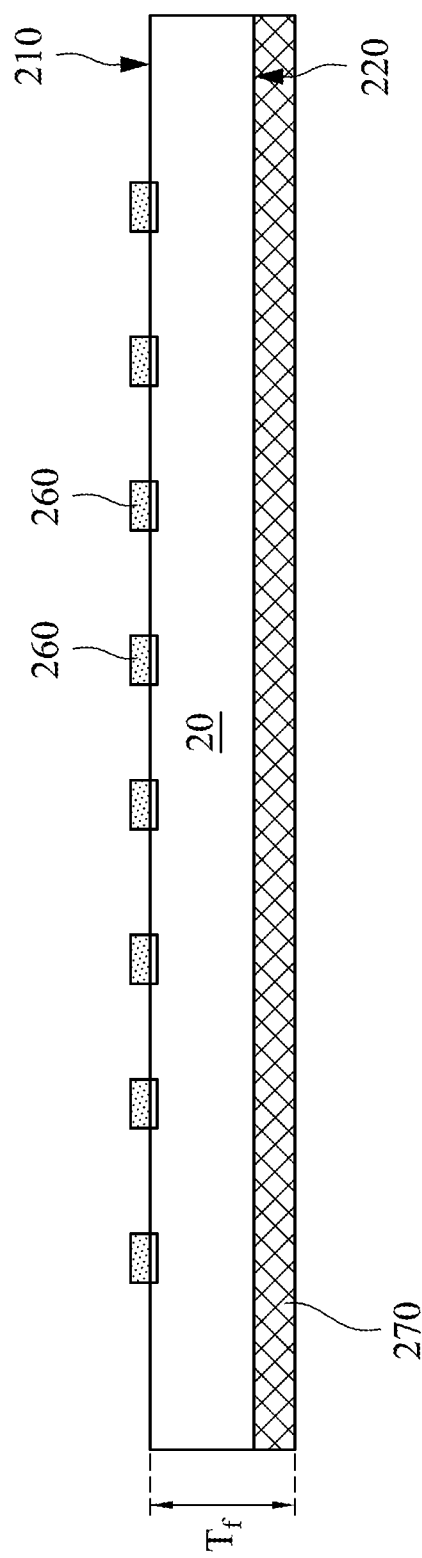

At step S340, an insulating layer 270 is formed under the lower surface 220, as shown in FIG. 2D. The insulating layer 270 may serve as a sealing layer of the chip package to protect the lower surface of the chip package. In the present embodiment, when the step S10 is completed with the formation of the insulating layer 270, a total thickness $T_f$ of the wafer 20 and the insulating layer 270 ranges from 120 µm to 210 µm, such as 125 µm, 130 µm, 135 µm, 140 µm, 145 µm, 150 µm, 155 µm, 160 µm, 165 µm, 170 µm, 175 µm, 180 µm, 185 µm, 190 µm, 195 µm, 200 µm, or 205 µm.

Figure 2E:
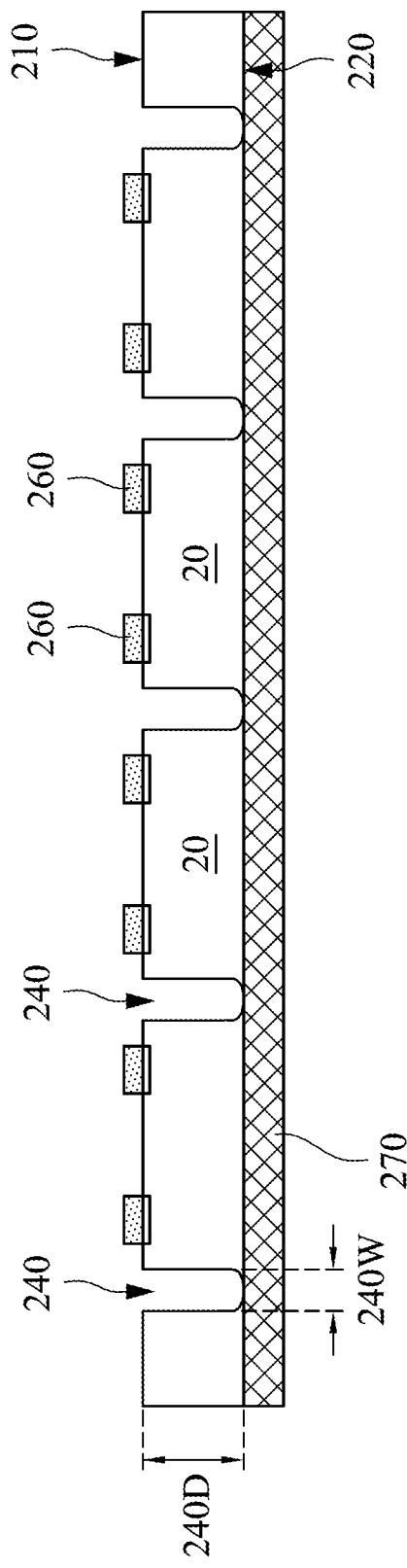

At step S350, the upper surface 210 of the wafer 20 is etched to form a plurality of trenches 240 exposing the insulating layer 270, as shown in FIG. 2E. In the present embodiment, the step S350 is done by a dry-etching process, such as plasma etching. In one example, a width 240W of each trench 240 ranges from 50 µm to 60 µm, and a depth 240D of each trench 240 ranges from 55 µm to 105 µm. For example, the width 240W may be 52 µm, 54 µm, 56 µm, or 58 µm, and the depth 240D may be 60 µm, 65 µm, 70 µm, 75 µm, 80 µm, 85 µm, 90 µm, 95 µm, or 100 µm, but is not limited thereto.

Figure 2F:
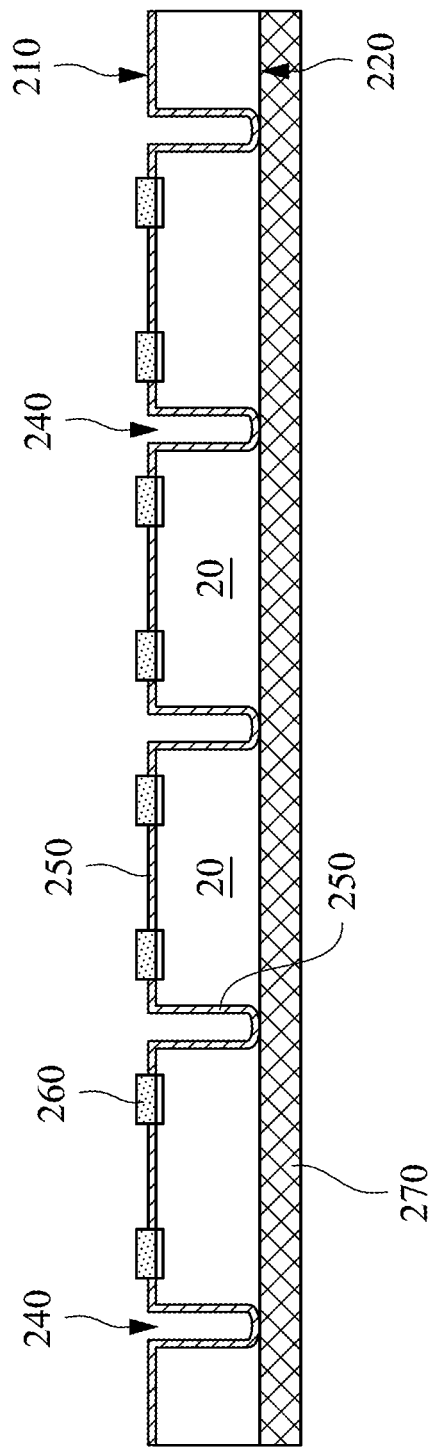

At step S360, a passivation layer 250 is formed covering an inner wall of the trenches 240, as shown in FIG. 2F. In some embodiments, the passivation layer 250 further covers the upper surface 210 of the wafer 20 and exposes the conductive bumps 260. It is noted that the passivation layer 250 may serve as a sealing layer of the subsequently formed chip package to protect the upper surface and sidewalls of the chip package.

In some embodiments, after performing the step S350 by forming the trenches 240 or the step S360 by forming the passivation layer 250, a laser mark (not shown) may be formed on the insulating layer 270 of the corresponding chip.

Figure 2G:
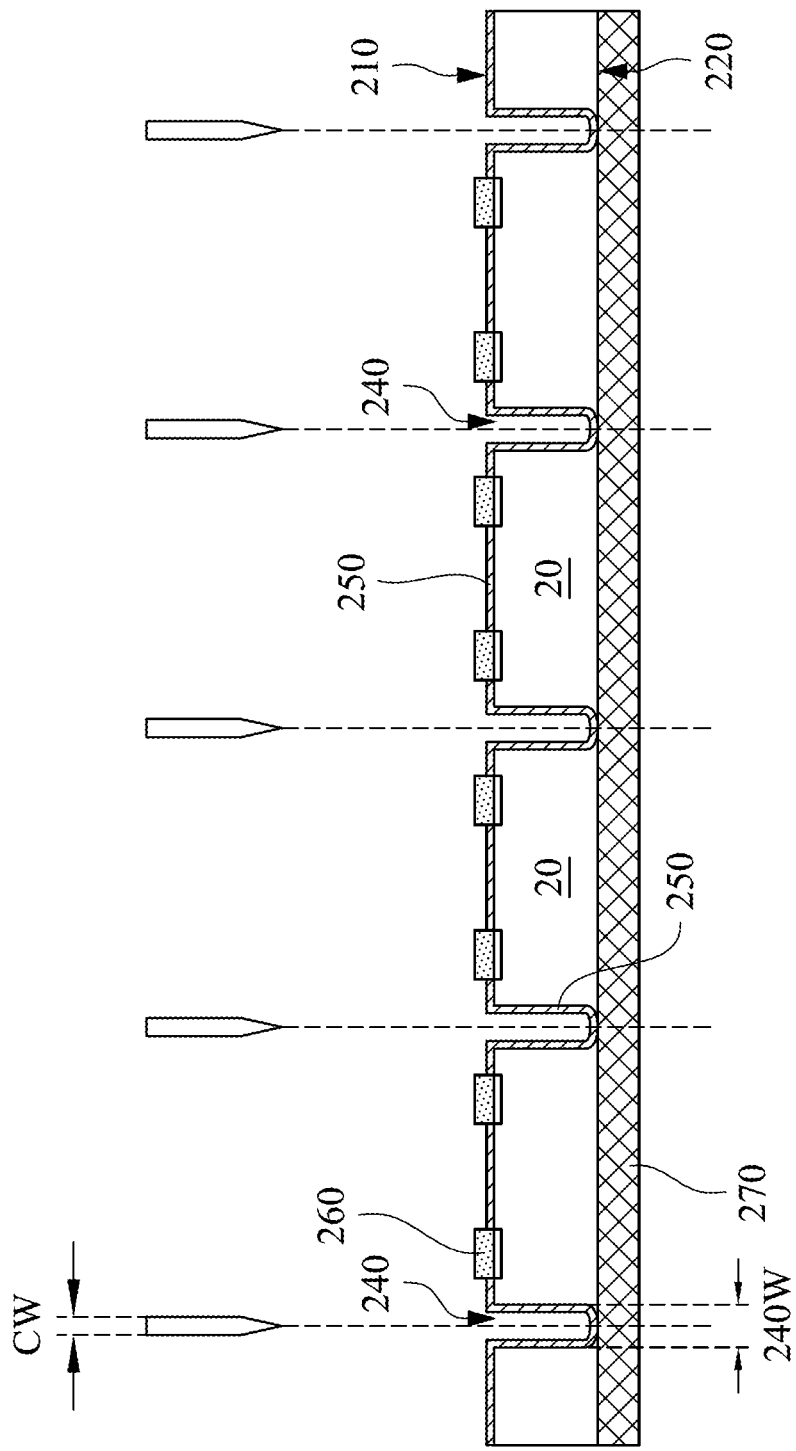

At step S370, the passivation layer 250 and the insulating layer 270 are diced along each trench 240 to form a plurality of chip packages, as shown in FIG. 2G. In one example, the passivation layer 250 and the insulating layer 270 are diced along a center of each trench 240 to form a plurality of chip packages. In some embodiments, the step S370 may be done by a wheel cutting process, a laser cutting process, or a waterjet cutting process. In the present embodiment, a cutting width CW of dicing the passivation layer 250 and the insulating layer 270 along each trench 240 ranges from 15 µm to 22 µm, such as 15.5 µm, 16.0 µm, 16.5 µm, 17.0 µm, 17.5 µm, 18.0 µm, 18.5 µm, 19.0 µm, 19.5 µm, 20.0 µm, 20.5 µm, 21.0 µm, or 21.5 µm. It is noted that the cutting width CW is smaller than the width 240W trenches 240. Therefore, in the chip package after completing the step S370, a portion of the passivation layer 250 may remain on the sidewalls of each chip package adjacent to the center of the trenches 240 and protect the chip package. In other words, every surface of the chip package is protected by the passivation layer 250 and the insulating layer 270, except that the conductive bumps 260 is exposed and serves to be electrically connected to other electrical components.

In various examples, the chip packages may be applied in light-sensing elements packaging or light-emitting elements packaging, but the application is not limited thereto. For example, the chip packages may be applied in electronic components of various integrated circuits that including discrete components, active or passive elements, digital or analog circuits, for example optoelectronic devices, micro electro mechanical system (MEMS), microfluidic systems, or physical sensors that measures the variation of some physical quantities such as heat, light, or pressure. Notably, a wafer scale package process (WSP) process may be applied for packaging semiconductor chips such as image-sensing elements, light-emitting diodes (LEDs) or non-light-emitting diodes, solar cells, RF circuits, accelerators, gyroscopes, micro actuators, surface acoustic wave devices, process sensors, or ink printer heads, and the like.

In summary, the method of manufacturing chip packages disclosed in the present invention may reduce process duration and cost, and the alignment offset can be eliminated.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided fall within the scope of the following claims.

What is claimed is:

1. A method of manufacturing chip package, comprising:
providing a wafer with an upper surface and a lower surface opposite thereto, the wafer comprising a plurality of conductive pads disposed on the upper surface;
forming a plurality of conductive bumps on the conductive pads, respectively;
thinning the wafer from the lower surface towards the upper surface;
forming an insulating layer under the lower surface;
etching the upper surface of the wafer to form a plurality of trenches exposing the insulating layer;
forming a passivation layer covering an inner wall of each of the trenches, wherein the passivation layer further covers the upper surface of the wafer and exposes the conductive bumps; and
dicing the passivation layer and the insulating layer along each of the trenches to form a plurality of chip packages.

2. The method of claim 1, wherein after the step of providing the wafer, a first thickness of the wafer ranges from 525 µm to 725 µm.

3. The method of claim 1, wherein a width of each trench ranges from 50 µm to 60 µm, and a depth of each trench ranges from 55 µm to 105 µm.

4. The method of claim 1, wherein after the step of thinning the wafer, a second total thickness of the wafer and the conductive bumps ranges from 100 µm to 150 µm.

* * * * *